(12) United States Patent
Chen et al.

(10) Patent No.: US 11,322,569 B2
(45) Date of Patent: May 3, 2022

(54) ARRAY SUBSTRATE WITH FIRST GATE, SECOND GATE, BINDING REGION WITH HOLE, AND MANUFACTURING METHOD OF SAME

(71) Applicant: WUHAN CHINA STAR OPTOELECTRONICS SEMICONDUCTOR DISPLAY TECHNOLOGY CO., LTD., Wuhan (CN)

(72) Inventors: Cheng Chen, Wuhan (CN); Yun Yu, Wuhan (CN)

(*) Notice: Subject to any disclaimer, the term of this patent is extended or adjusted under 35 U.S.C. 154(b) by 186 days.

(21) Appl. No.: 16/641,660

(22) PCT Filed: Nov. 18, 2019

(86) PCT No.: PCT/CN2019/119292
§ 371 (c)(1),
(2) Date: Feb. 25, 2020

(87) PCT Pub. No.: WO2021/042574
PCT Pub. Date: Mar. 11, 2021

(65) Prior Publication Data
US 2021/0280660 A1    Sep. 9, 2021

(30) Foreign Application Priority Data
Sep. 2, 2019   (CN) .......................... 201910822395.6

(51) Int. Cl.
*H01L 27/32* (2006.01)
*H01L 51/56* (2006.01)

(52) U.S. Cl.
CPC ...... *H01L 27/3276* (2013.01); *H01L 27/3246* (2013.01); *H01L 51/56* (2013.01); *H01L 2227/323* (2013.01)

(58) Field of Classification Search
CPC . H01L 27/3276; H01L 27/3246; H01L 51/56; H01L 2227/323
See application file for complete search history.

(56) References Cited

U.S. PATENT DOCUMENTS

| 2009/0050894 | A1  | 2/2009  | Park et al. |
| 2016/0225907 | A1* | 8/2016  | Kim ................... H01L 27/3276 |
| 2019/0148474 | A1* | 5/2019  | Bu ...................... H01L 27/3276 257/40 |
| 2019/0164998 | A1* | 5/2019  | Cho ..................... G09G 3/3266 |
| 2019/0386040 | A1* | 12/2019 | Wang .................... H01L 27/124 |
| 2019/0393289 | A1* | 12/2019 | Hu ...................... H01L 27/3258 |
| 2020/0192507 | A1  | 6/2020  | Bu |

FOREIGN PATENT DOCUMENTS

CN            109448570 A       3/2019

* cited by examiner

*Primary Examiner* — Lex H Malsawma

(57) ABSTRACT

The present application provides an array substrate and a manufacturing method of the same, the array substrate includes a display region, the display region includes a thin film transistor structure layer including a gate electrode layer and a source drain electrode layer, wherein the gate electrode layer and the source drain electrode layer are made of an alloy material including one or a group selected from Al, Ge, Nd, Ta, Zr, Ni, or La.

5 Claims, 3 Drawing Sheets

ARRAY SUBSTRATE WITH FIRST GATE, SECOND GATE, BINDING REGION WITH HOLE, AND MANUFACTURING METHOD OF SAME

CROSS REFERENCE TO RELATED APPLICATION

This application claims priority to Chinese Application No. 201910822395.6, filed on 2019 Sep. 2, having a title of "ARRAY SUBSTRATE AND MANUFACTURING METHOD OF SAME". The entire disclosure of the above application is incorporated herein by reference.

BACKGROUND OF INVENTION

Field of Invention

The present application relates to the field of display, and particularly to an array substrate and a manufacturing of the same.

Description of Prior Art

Organic light emitting diodes (OLEDs) are more and more widely used due to them being light weight, self-emission, wide viewing angles, low driving voltage, high luminous efficiency, low power consumption, and fast response speed. Especially flexible OLED display device is bendable and is easy to be carried, it has become a main field of research and development in the field of display technology. At present, high-end mobile phones have higher requirements for brightness uniformity. How to improve the brightness uniformity of the screen is a key direction for major manufacturers.

SUMMARY OF INVENTION

In order to solve the above problem, the present application provides an array substrate comprising a display region, wherein the display region comprises: a thin film transistor structure layer comprising a gate electrode layer and a source drain electrode layer, wherein the gate electrode layer and the source drain electrode layer are made of an alloy material comprising one or a group selected from Al, Ge, Nd, Ta, Zr, Ni, or La.

Further, the array substrate comprises a non-display region surrounding the display region, the non-display region comprises a binding region and a fan out region disposed between the binding region and the display region, and the display region comprises a main display region and an auxiliary region disposed between the main display region and the fan out region; wherein the thin film transistor structure layer further comprises: a substrate extending from the display region to the non-display region; a barrier layer formed on the substrate and extending from the display region to the non-display region; a buffer layer formed on the barrier layer and extending from the display region to the non-display region; an active layer formed on the buffer layer of the main display region; and a first insulating layer formed on the buffer layer, covering the active layer, and extending to the non-display region; wherein the gate electrode layer comprises a first gate electrode layer and a second gate electrode layer; and the first gate electrode layer is formed on the first insulating layer; a second insulating layer formed on the first insulating layer, covering the first gate electrode layer, and extending to the non-display region; wherein the second gate electrode layer is formed on the second insulating layer; and a third insulating layer formed on the second insulating layer, covering the second gate electrode layer, and extending to the non-display region; wherein the source drain electrode layer comprises: a first source drain electrode layer formed on the third insulating layer of the main display region and penetrating through the third insulating layer, the second insulating layer, and the first insulating layer to connect the active layer; and a planarization layer formed on the third insulating layer, covering the source drain electrode layer, and extending to the non-display region.

Further, a hole is disposed in the binding region, the hole penetrates through the first insulating layer, the second insulating layer, the third insulating layer, and the planarization layer, the hole comprises a bottom surface, the bottom surface attaches the substrate.

Further, the first gate electrode layer comprises: a first metal section disposed in the main display region and corresponding to the active layer; and a second metal section extending from the fan out region to the binding region and covering an inside surface of the hole; the second gate electrode layer comprises: a third metal section disposed in the main display region and corresponding to the active layer; a fourth metal section disposed on the second insulating layer of the auxiliary region; and a fifth metal section disposed on second insulating layer of the fan out region, wherein a projection shape of the second gate electrode layer projected on the substrate is a mesh structure, the mesh structure comprises a plurality of hollow out areas and a wirings area surrounding the plurality of the hollow out areas.

Further, the source drain electrode layer further comprises: a second source drain electrode layer formed on the third insulating layer of the auxiliary region, penetrating through the third insulating layer to correspondingly connect to the fourth metal section; a third source drain electrode layer formed on the third insulating layer of the fan out region, wherein the third source drain electrode layer is connected to the second metal section and the fifth metal section of the fan out region.

Further, the array substrate further comprises: an anode layer formed on the planarization layer of the main display region, penetrating through the planarization layer, and connected to the first source drain electrode layer; a pixel defining layer formed on the planarization layer, covering the anode layer, and extending to the non-display region, a light emitting hole is disposed in the pixel defining layer and corresponds to the anode layer, the light emitting hole comprises a bottom surface, the bottom surface is defined at one side of the anode layer far away from the planarization layer; and an organic layer filled into the hole, wherein one side of the organic layer far away from the hole is aligned over one side of the third insulating layer near the planarization layer.

The present application also provides a manufacturing method of an array substrate, wherein the array substrate comprises a display region, and further comprises a non-display region surrounding the display region, the non-display region comprises a binding region and a fan out region disposed between the binding region and the display region, the display region comprises a main display region and an auxiliary region disposed between the main display region and the fan out region, the fan out region is disposed between the display region and the binding region, wherein the method comprises: a step S1) of forming a thin film transistor structure layer, wherein the thin film transistor structure layer comprising a gate electrode layer and a source drain electrode layer, wherein the gate electrode layer and the source drain electrode layer are made of an alloy material comprising one or a group selected from Al, Ge, Nd, Ta, Zr, Ni, or La.

Further, in the step S1), a manufacturing process of the thin film transistor structure layer comprises: a step S101) of providing a substrate; a step S102) of depositing a barrier layer on the barrier layer; a step S103) of depositing a buffer layer on the barrier layer; a step S104) of depositing a first insulating layer on the buffer layer of the main display region, wherein the first insulating layer covers the active layer and extends to the non-display region; a step S105) of forming a first gate electrode layer on the first insulating layer; a step S106) of depositing a second insulating layer on the first insulating layer, wherein the second insulating layer covers the first gate electrode layer and extends to the non-display region; a step S107) of forming a second gate electrode layer on the second insulating layer; a step S108) of depositing a third insulating layer on the second insulating layer, wherein the third insulating layer covers the second gate electrode layer and extends to the non-display region; a step S109) of employing a hole etching process to the third insulating layer, the second insulating layer, and the first insulating layer, a layer of a first source drain electrode layer is formed on the third insulating layer of the main display region, the first source drain electrode layer penetrates through the hole disposed in the third insulating layer, the second insulating layer, and the first insulating layer to connect to the active layer; a step S110) of forming a planarization layer on the third insulating layer and extending to the non-display region, wherein the planarization layer covers the source drain electrode layer.

Further, the manufacturing method of the array substrate further comprises: a step S2) of disposing a through hole in the planarization layer corresponding to the first source drain electrode layer, and depositing an anode layer on the planarization layer, wherein the anode layer is connected to the first source drain electrode layer by the through hole; a step S3) of depositing a pixel defining layer on the planarization layer, wherein the pixel defining layer covers the anode layer; a step S4) of disposing a light emitting hole in the pixel defining layer corresponding to a region of the anode layer, wherein a bottom surface of the light emitting hole is totally on the anode layer.

Further, in the step S109), further comprises: etching the binding region to form a hole, wherein the hole penetrates through the first insulating layer, the buffer layer, and the barrier layer to make a bottom surface of the hole attach the substrate, and an organic matter is filled into the hole to form an organic layer, wherein one side of the organic layer far away from the hole is aligned over one side of the third insulating layer near the planarization layer; wherein in the step S105), a manufacturing process of the first gate electrode layer comprises: forming a first metal section on the first insulating layer of the main display region, wherein the first metal section corresponds to the active layer; and forming a second metal section on the first insulating layer from the fan out region to the binding region, wherein the second metal section covers an inside surface of the hole from the first insulating layer; and wherein in the step S107), a manufacturing process of the second gate electrode layer comprises: forming a third metal section on the second insulating layer of the display region, wherein the third metal section corresponds to the first metal section; forming a fourth metal section on the second insulating layer of the auxiliary region; and forming a fifth metal section on the second insulating layer of the fan out region.

The benefit of the present application is: the present application provides an array substrate and a manufacturing method of the array substrate, wirings formed on the array substrate are made of high conductivity metal material to improve the brightness uniformity of the screen without increasing process cost; high resistivity, bending resistant metal material is used and improve conductivities of the wirings and bending characteristics of the screen, the array substrate has a double-layer VDD trace design to reduce IR Drop and improve the brightness uniformity of the screen.

Figure 1:
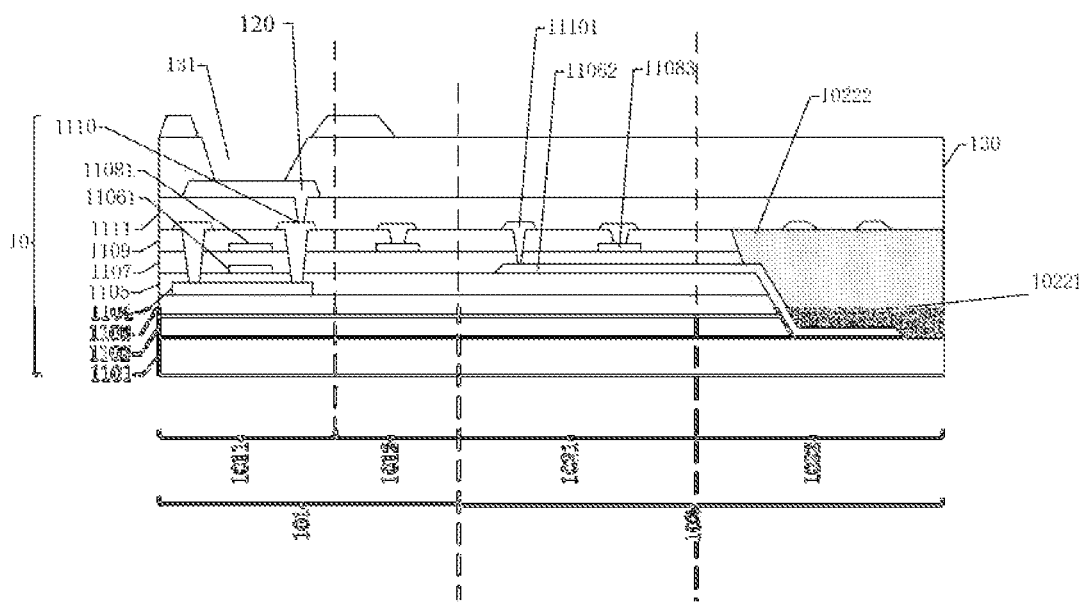
FIG. 1 is a schematic diagram of an array substrate of one embodiment.

| | |
|---|---|
| 110 thin film transistor structure layer; | 120 anode layer; |
| 130 pixel defining layer; | 1101 substrate; |
| 1102 barrier layer; | 1103 buffer layer; |
| 1104 active layer; | 1105 first insulating layer; |
| 1106 first gate electrode layer; | 1107 second insulating layer; |
| 1108 second gate electrode layer; | 1109 third insulating layer; |
| 1110 first source drain electrode layer; | 1111 planarization layer; |
| 101 display region; | 102 non-display region; |
| 1021 fan out region; | 1022 binding region; |
| 1011 main display region; | 1012 auxiliary region; |
| 11061 first metal section; | 11062 second metal section; |
| 11081 third metal section; | 11082 fourth metal section; |
| 11083 fifth metal section; | 11101 second source drain electrode layer; |
| 10221 hole; | 10222 organic layer. |

DETAILED DESCRIPTION OF PREFERRED EMBODIMENTS

The following description of the various embodiments is provided to illustrate the specific embodiments of the invention. Directional terms mentioned in the present invention, such as "upper", "lower", "previous", "post", "left", "right", "inside", "outside", "side", etc., are merely references to the direction of the appended drawings. Therefore, the directional terminology used is for the purpose of illustration and understanding of the invention. In the figures, structurally similar elements are denoted by the same reference numerals.

Embodiment

Referring to FIG. 1, in this embodiment, an array substrate 10 of the present application includes a thin film transistor layer 110, an anode layer 120, and a pixel defining layer 130.

The thin film transistor layer 110 includes a substrate 1101, a barrier layer 1102, a buffer layer 1103, an active layer 1104, a first insulating layer 1105, a first gate electrode layer 1106, a second insulating layer 1107, a second gate electrode layer 1108, a third insulating layer 1109, a first source drain electrode layer 1110, and a planarization layer 1111.

The barrier layer 1102 is formed on the substrate 1101, the barrier layer 1102 is made of materials including one of a group selected from silicon oxide, silicon nitride, silicon oxynitride, and amorphous silicon, and is mainly used to block water and oxygen and prevent water and oxygen from attacking the array substrate 10.

The buffer layer 1103 is formed on the barrier layer 1102, the buffer layer 1103 is made of insulating materials which acts as a buffer and can also prevent short circuiting of the electrode layer formed on the buffer layer 1103 at the same time.

The array substrate 10 of the present application also includes a display region 101 and a non-display region 102 surrounding the display region 101. The non-display region 102 includes a binding region 1022 and a fan out region 1021 disposed between the binding region 1022 and the display region 102. The display region 101 includes a main display region 1011 and an auxiliary region 1012 disposed between the main display region 1011 and the fan out region 1021.

Figure 2:
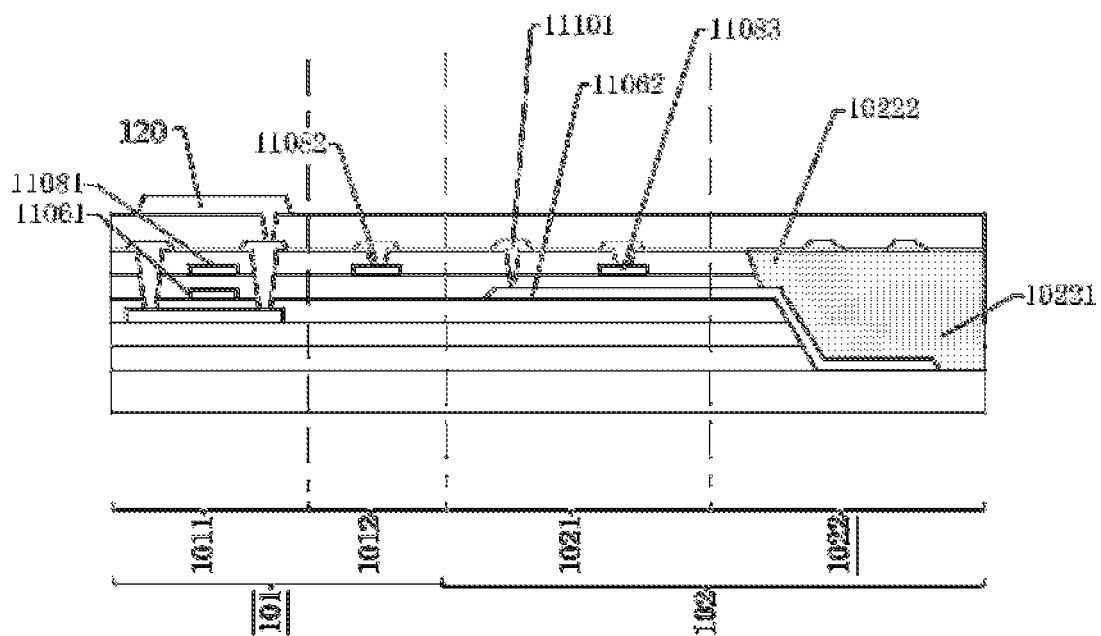
FIG. 2 is a partial schematic diagram of the array substrate of one embodiment.

Referring to FIG. 2, the active layer 1104 is formed on the buffer layer 1103. The first insulating layer 1105 is formed on the buffer layer 1103 and covers the active layer 1104. The first gate electrode layer 1106 includes a first metal section 11061 and a second metal section 11062. The second gate electrode layer 1108 includes a third metal section 11081, a fourth metal section 11082, and a fifth metal section 11083.

Figure 3:
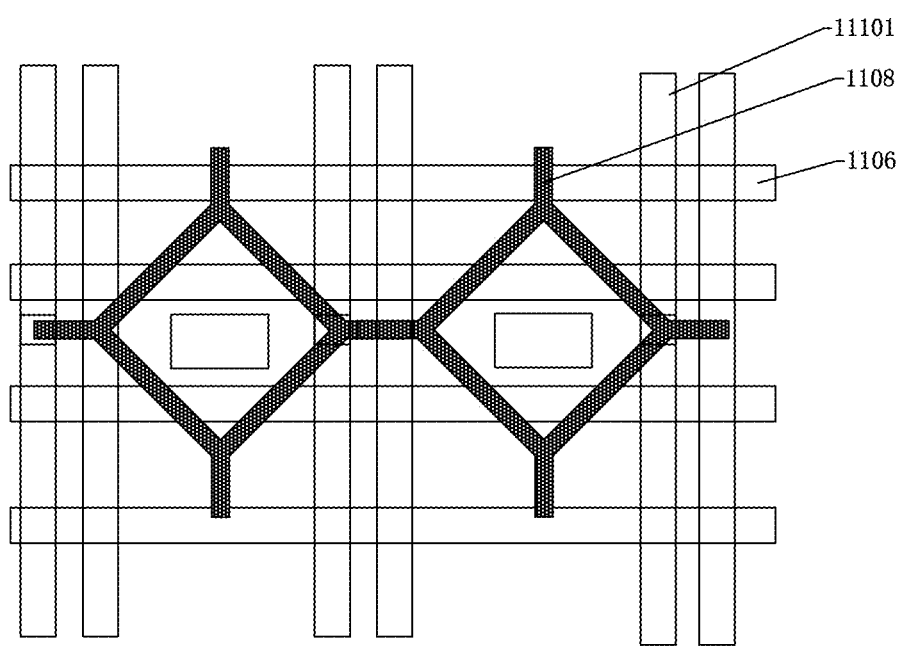
FIG. 3 is a partial schematic diagram of a thin film transistor layer of the array substrate of one embodiment.

The first metal section 11061 is formed on the first insulating layer 1105. The second insulating layer 1107 is formed on the first insulating layer 1105 and covers the first metal section 11061. The third metal section 11081 is formed on the second insulating layer 1107. The third insulating layer 1109 is formed on the second insulating layer 1107 and covers the third metal section 11081. The first metal section 11061 and the third metal section 11081 correspond to the active layer 1104. Referring to FIG. 3, the second gate electrode layer 1108 disposed on the second insulating layer 1107 is mesh structure to reduce IR Drop and improve the brightness uniformity of the screen.

The invention adopts a double gate electrode structure, which can adjust the threshold voltage uniformity of the thin film transistor layer 140.

The first source drain electrode layer 1110 is formed on the third insulating layer 1109 disposed in the main display region 1011. The first source drain electrode layer 1110 includes two pins. The pins penetrate through the third insulating layer 1109, the second insulating layer 1107, and the first insulating layer 1105 successively and are electrically connected to the active layer 1104.

The planarization layer 1111 is formed on the third insulating layer 1109 and covers the first source drain electrode layer 1110.

In the auxiliary region 1012, the fourth metal section 11082 is formed on the second insulating layer 1107. The source drain electrode layer is formed on the third insulating layer 1109 corresponding to the fourth metal section 11082. The source drain electrode layer penetrates through the third insulating layer 1109 and is electrically connected to the fourth metal section 11082.

The first insulating layer 1105, the second insulating layer 1107, third insulating layer 1109, and the planarization layer 1111 extend from the display region 101 to the non-display region 102. In the fan out region 1021, the second metal section 11062 is formed on the first insulating layer 1105. The second metal section 11062 extends from the fan out region 1021 to the binding region 1022. The fifth metal section 11083 is formed on the second insulating layer 1107. The second source drain electrode layer 11101 is formed on the third insulating layer 1109. The second source drain electrode layer 11101 includes two pins, one of the two pins penetrates through the third insulating layer 1109 and the second insulating layer 1107 and is electrically connected to the second metal section 11062, another one of the two pins penetrates through the third insulating layer 1109 and is connected to the fifth metal section 11083. In the fan out region 1021, the second metal section 11062 is used to transmit data signals, and the second source drain electrode layer 11101 is used to transmit VDD signals to reduce IR Drop and improve the brightness uniformity.

The first gate electrode layer 1106, the second gate electrode layer 1108, the first source drain electrode layer 1110, and the second source drain electrode layer 11101 are made of an alloy material including one or a group selected from Al, Ge, Nd, Ta, Zr, Ni, La, and so on to improve conductivities and bending performances of the first gate electrode layer 1106, the second gate electrode layer 1108, the first source drain electrode layer 1110, and the second source drain electrode layer 11101, to reduce risk of dynamic bending breaks, and same metal materials adopted in different layers increases the possibility of changing wirings design.

A hole 10221 is disposed in the binding region 1022, the hole 10221 penetrates through the first insulating layer 1105, the second insulating layer 1107, the third insulating layer 1109, and the planarization layer 1111 to making a bottom of the hole 10221 attaching to the substrate 1101. The first gate electrode layer 1106 extend from the fan out region 1021 to the binding region 1022. In details, in the binding region 1022, the first gate electrode layer 1106 extends from a boundary of the binding region 1022 and the fan out region 1021 to the hole 10221 and covers an inside surface of the hole 10221. Because the hole 10221 penetrating through the first insulating layer 1105, the second insulating layer 1107, the third insulating layer 1109, and the planarization layer 1111, the first gate electrode layer 1106 used for transmitting data signals totally moves down and is closer to the neutral plane, thereby contributing to improve bending reliability of the binding region 103 and reducing a risk of disconnection.

An organic layer 10222 is filled into the hole 10221, the organic layer 10222 is made of organic matter to prevent foreign matter from entering the hole 10221.

The anode layer 120 is formed in the display region 101. In details, the anode layer 120 is formed on the planarization layer 1111 and corresponds to the first source drain electrode layer 1110. The anode layer 120 includes a pin, the pin penetrates through the planarization layer 1111 and is electrically connected to the first source drain electrode layer 1110.

The pixel defining layer 130 is formed on the planarization layer 1111. In details, a pixel hole 131 is disposed in the pixel defining layer 130 and corresponds to the anode layer 120. Due to loading ink in the subsequent inkjet printing process, barricades 132 are formed on both sides of the pixel hole 131 to prevent ink overflow in the subsequent inkjet printing process.

Figure 4:
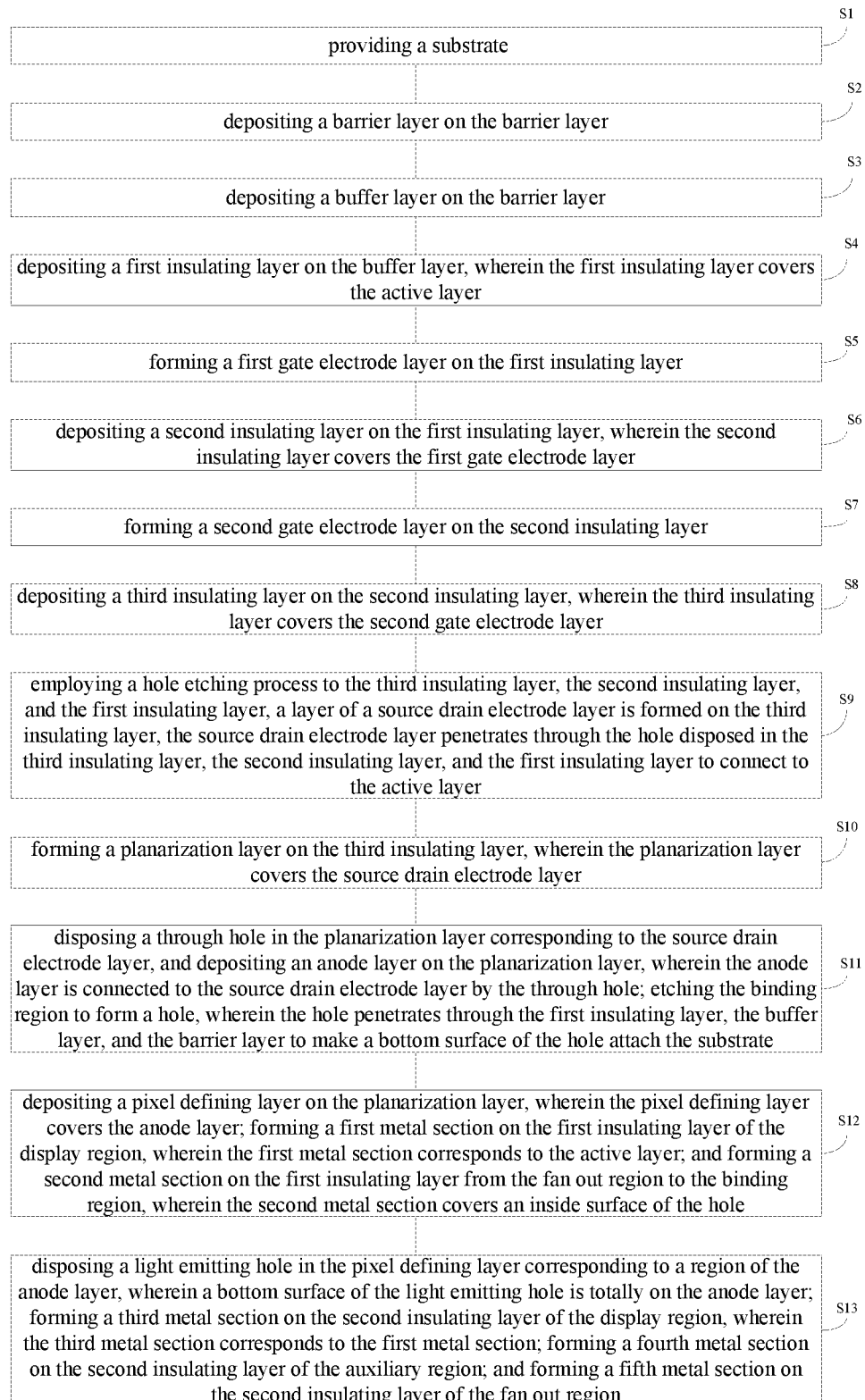
FIG. 4 is a manufacturing flow chart of the array substrate of one embodiment.

In order to better explain the application, referring to FIG. 4, a manufacturing method of the array substrate of the present application includes:

S1) a substrate is provided.
S2) a barrier layer is deposited on the substrate.
S3) a buffer layer is deposited on the barrier layer.
S4) a first insulating layer is deposited on the buffer layer, the first insulating layer covers the active layer.

S5) a first gate electrode layer is formed on the first insulating layer.

S6) a second insulating layer is deposited on the first insulating layer, the second insulating layer covers the first gate electrode layer.

S7) a second gate electrode layer is formed on the second insulating layer.

S8) a third insulating layer is deposited on the second insulating layer, the third insulating layer covers the second gate electrode layer.

S9) a hole etching is employed to the third insulating layer, the second insulating layer and the first insulating layer, a source drain electrode layer is formed on the third insulating layer, the source drain electrode layer penetrates the hole disposed in the third insulating layer, the second insulating layer, and the first insulating layer to electrically connect to the active layer.

S10) a planarization layer is formed on the third insulating layer, the planarization layer covers the source drain electrode layer.

The gate electrode layer and the source drain electrode layer are made of an alloy material including one or a group selected from Al, Ge, Nd, Ta, Zr, Ni, La, and so on.

S11) a through hole is disposed in the source drain electrode layer corresponding to the planarization layer, an anode layer is deposited on the planarization layer, the anode layer is electrically connected to the source drain electrode layer by the through hole, a hole is disposed in the binding region by etching, the hole penetrates through the first insulating layer, the buffer layer, and the barrier layer to making a bottom of the hole attaching to the substrate.

S12) a pixel defining layer is deposited on the planarization layer, the pixel defining layer covers the anode layer, a first metal section is formed on the first insulating layer in the display region, the first metal section corresponds to the active layer; a second metal section is formed on the first insulating layer from the fan out region to the binding region, the second metal section covers an inside surface of the hole.

S13) a light emitting hole is disposed in the pixel defining layer corresponding to a region of the anode layer, a bottom surface of the light emitting hole is totally on the anode layer and upon the third metal section formed on the second insulating layer of the display region, the third metal section corresponds to the first metal section; a fourth metal section is formed on the second insulating layer of an auxiliary region, a fifth metal section is formed on the second insulating layer of a fan out region.

The above are only preferred embodiments of the present invention, and are not intended to limit the present invention. Any modification, equivalent replacement, and improvement made within the spirit and principle of the present invention shall be included in the protection scope of the present invention.

What is claimed is:

1. An array substrate comprising a display region and a non-display region surrounding the display region, wherein the display region comprises:
a thin film transistor structure layer comprising a gate electrode layer and a source drain electrode layer, wherein the gate electrode layer and the source drain electrode layer are made of an alloy material comprising one or a group selected from Al, Ge, Nd, Ta, Zr, Ni, or La;
the non-display region comprises a binding region and a fan out region disposed between the binding region and the display region, and the display region comprises a main display region and an auxiliary region disposed between the main display region and the fan out region
wherein the thin film transistor structure layer comprises:
a substrate extending from the display region to the non-display region;
a barrier layer formed on the substrate and extending from the display region to the non-display region;
a buffer layer formed on the barrier layer and extending from the display region to the non-display region;
an active layer formed on the buffer layer of the main display region; and
a first insulating layer formed on the buffer layer, covering the active layer, and extending to the non-display region;
wherein the gate electrode layer comprises a first gate electrode layer and a second gate electrode layer; and
the first gate electrode layer is formed on the first insulating layer;
a second insulating layer formed on the first insulating layer, covering the first gate electrode layer, and extending to the non-display region;
wherein the second gate electrode layer is formed on the second insulating layer; and
a third insulating layer formed on the second insulating layer, covering the second gate electrode layer, and extending to the non-display region;
wherein the source drain electrode layer comprises:
a first source drain electrode layer formed on the third insulating layer of the main display region and penetrating through the third insulating layer, the second insulating layer, and the first insulating layer to connect the active layer;
a planarization layer formed on the third insulating layer, covering the source drain electrode layer, and extending to the non-display region;
a second source drain electrode layer formed on the third insulating layer of the auxiliary region, penetrating through the third insulating layer to correspondingly connect to the fourth metal section; and
a third source drain electrode layer formed on the third insulating layer of the fan out region, wherein the third source drain electrode layer is connected to the second metal section and the fifth metal section of the fan out region.

2. The array substrate of claim 1, wherein a hole is disposed in the binding region, the hole penetrates through the first insulating layer, the second insulating layer, the third insulating layer, and the planarization layer, the hole comprises a bottom surface, the bottom surface attaches the substrate.

3. The array substrate of claim 2 further comprises:
an anode layer formed on the planarization layer of the main display region, penetrating through the planarization layer, and connected to the first source drain electrode layer;
a pixel defining layer formed on the planarization layer, covering the anode layer, and extending to the non-display region, a light emitting hole is disposed in the pixel defining layer and corresponds to the anode layer, the light emitting hole comprises a bottom surface, the bottom surface is defined at one side of the anode layer far away from the planarization layer; and
an organic layer filled into the hole, wherein one side of the organic layer far away from the hole is aligned over one side of the third insulating layer near the planarization layer.

4. The array substrate of claim 1, wherein the first gate electrode layer comprises:
  a first metal section disposed in the main display region and corresponding to the active layer; and
  a second metal section extending from the fan out region to the binding region and covering an inside surface of the hole;
  the second gate electrode layer comprises:
  a third metal section disposed in the main display region and corresponding to the active layer;
  a fourth metal section disposed on the second insulating layer of the auxiliary region; and
  a fifth metal section disposed on second insulating layer of the fan out region, wherein a projection shape of the second gate electrode layer projected on the substrate is a mesh structure, the mesh structure comprises a plurality of hollow out areas and a wirings area surrounding the plurality of the hollow out areas.

5. A manufacturing method of an array substrate, wherein the array substrate comprises a display region, and further comprises a non-display region surrounding the display region, the non-display region comprises a binding region and a fan out region disposed between the binding region and the display region, the display region comprises a main display region and an auxiliary region disposed between the main display region and the fan out region, the fan out region is disposed between the display region and the binding region, wherein the method comprises:
  a step S1) of forming a thin film transistor structure layer, wherein the thin film transistor structure layer comprising a gate electrode layer and a source drain electrode layer, wherein the gate electrode layer and the source drain electrode layer are made of an alloy material comprising one or a group selected from Al, Ge, Nd, Ta, Zr, Ni, or La;
  a step S2) of disposing a through hole in the planarization layer corresponding to the first source drain electrode layer, and depositing an anode layer on the planarization layer, wherein the anode layer is connected to the first source drain electrode layer by the through hole;
  a step S3) of depositing a pixel defining layer on the planarization layer, wherein the pixel defining layer covers the anode layer;
  a step S4) of disposing a light emitting hole in the pixel defining layer corresponding to a region of the anode layer, wherein a bottom surface of the light emitting hole is totally on the anode layer;
  wherein the step S1) comprises:
  a step S101) of providing a substrate;
  a step S102) of depositing a barrier layer on the barrier layer;
  a step S103) of depositing a buffer layer on the barrier layer;
  a step S104) of depositing a first insulating layer on the buffer layer of the main display region, wherein the first insulating layer covers the active layer and extends to the non-display region;
  a step S105) of forming a first gate electrode layer on the first insulating layer;
  a step S106) of depositing a second insulating layer on the first insulating layer, wherein the second insulating layer covers the first gate electrode layer and extends to the non-display region;
  a step S107) of forming a second gate electrode layer on the second insulating layer;
  a step S108) of depositing a third insulating layer on the second insulating layer, wherein the third insulating layer covers the second gate electrode layer and extends to the non-display region;
  a step S109) of employing a hole etching process to the third insulating layer, the second insulating layer, and the first insulating layer, a layer of a first source drain electrode layer is formed on the third insulating layer of the main display region, the first source drain electrode layer penetrates through the hole disposed in the third insulating layer, the second insulating layer, and the first insulating layer to connect to the active layer; and
  a step S110) of forming a planarization layer on the third insulating layer and extending to the non-display region, wherein the planarization layer covers the source drain electrode layer; and
  wherein the step S105) comprises:
  forming a first metal section on the first insulating layer of the main display region, wherein the first metal section corresponds to the active layer; and
  forming a second metal section on the first insulating layer from the fan out region to the binding region, wherein the second metal section covers an inside surface of the hole from the first insulating layer;
  wherein in the step S107) comprises:
  forming a third metal section on the second insulating layer of the display region, wherein the third metal section corresponds to the first metal section;
  forming a fourth metal section on the second insulating layer of the auxiliary region; and
  forming a fifth metal section on the second insulating layer of the fan out region;
  wherein the step S109) comprises: etching the binding region to form a hole;
  wherein the hole penetrates through the first insulating layer, the buffer layer, and the barrier layer to make a bottom surface of the hole attach the substrate, and an organic matter is filled into the hole to form an organic layer; and
  wherein one side of the organic layer far away from the hole is aligned over one side of the third insulating layer near the planarization layer.

* * * * *